United States Patent [19]

Murase

[11] Patent Number: 5,502,007
[45] Date of Patent: Mar. 26, 1996

[54] METHOD OF FORMING FLAT SURFACE OF INSULATOR FILM OF SEMICONDUCTOR DEVICE

[75] Inventor: Hiroshi Murase, Tokyo, Japan

[73] Assignee: NEC Corporation, Tokyo, Japan

[21] Appl. No.: 283,295

[22] Filed: Jul. 28, 1994

[30] Foreign Application Priority Data

Jul. 29, 1993 [JP] Japan .................... 5-207218

[51] Int. Cl.$^6$ ............... H01L 21/302; H01L 21/463
[52] U.S. Cl. ............ 437/225; 437/228; 437/195; 156/636.1
[58] Field of Search .................... 437/225, 228, 437/195; 156/636

[56] References Cited

U.S. PATENT DOCUMENTS 5,166,096  11/1992  Cote et al. ................... 437/195
5,356,513  10/1994  Burke et al. ................. 156/636

FOREIGN PATENT DOCUMENTS 62-216344  9/1987  Japan .

OTHER PUBLICATIONS

Wolf et al., vol. 1, pp. 171–174 and 194, *Silicon Processing for the VLSI ERA*, Lattice Press, 1986.

*Primary Examiner*—George Fourson
*Assistant Examiner*—H. Jey Tsai
*Attorney, Agent, or Firm*—Popham, Haik, Schnobrich & Kaufman, Ltd.

[57] ABSTRACT

A method of forming a flat surface of an insulator film of a semiconductor device, providing no excessive polishing, polishing waste that is easily removed and an extensive flat surface of the insulator film. A first wiring film is formed on or over a semiconductor substrate and a first insulator film is formed on the first wiring film. The first insulator film and the first wiring film are patterned to a given shape in the same patterning process. A second insulator film is formed on the first insulator film thus patterned. The second insulator film is relatively higher in polishing rate than the first insulator film. Then, a surface of the second insulator film is polished to be flattened under pressure until the first insulator film is exposed. As the first and second insulator films, a silicon nitride film and a silicon dioxide film are preferably used, respectively.

8 Claims, 7 Drawing Sheets

5,502,007

METHOD OF FORMING FLAT SURFACE OF INSULATOR FILM OF SEMICONDUCTOR DEVICE

BACKGROUND OF THE INVENTION

1. Field of the Invention

The present invention relates to a method of fabricating a semiconductor device and more particularly, to a method of forming a flat surface of an insulator film of a semiconductor device containing a polishing process, which is applicable for multilayer interconnection of the semiconductor device.

2. Description of the Prior Art

FIGS. 1A and 1D show a conventional method of forming a flat surface of an insulator film of a semiconductor device, which is disclosed in the Japanese Non-Examined Patent Publication No. 62-216344.

First, as shown in FIG. 1A, a first insulator film 42 of silicon dioxide ($SiO_3$) is formed on the surface of a silicon (Si) substrate 41. Then, a first wiring film 53 is formed on the first insulator film 42 to be patterned to a given shape.

Next, an interlayer insulator film 51 of phosphor-silicate glass (PSG) is formed on the first wiring film 53 patterned. The first interlayer insulator film 51 is in contact with the first insulator film 42 at the positions where the first wiring film 53 does not exist.

Subsequently, a polishing stopper film 52 of silicon nitride ($Si_3N_4$) is formed on the first interlayer insulator film 51 by a plasma-enhanced chemical vapor deposition (CVD) method and then, a plurality of through holes 49 are formed to pass through the polishing stopper film 52 and the first interlayer insulator film 51 by a popular technique such as photolithography and etching. The through holes 49 reach the surface of the first wiring film 53, respectively.

Next, as shown in FIG. 15, a conductive film 54 of aluminum (Al) for interconnection is formed on the polishing stopper film 52 by a sputtering method. The conducive film 54 thus formed is in contact with the first wiring film 53 through the through holes 49 at different positions.

The first conductive film 54 for interconnection is polished until the polishing stopper film 52 disposed thereunder is exposed. Thus, as shown in FIG. 1C, the conductive film 54 is left in the respective through holes 49, in other words, the remainder of the conductive film 54 is buried in the respective through holes 49.

Then, a second wiring film 50 is formed on the polishing stopper film 52, and as a result, the second wiring film 50 is interconnected with the first wiring film 53 through the remainder of the first conductive film 54 in the through holes 49.

Thereafter, the second wiring film 50 is patterned to a given shape as required.

As described above, with the conventional method, the Al film 54 is removed by the polishing process, and a flatter surface of the second wiring film 50 is obtained by utilizing a low polishing rate of $Si_3N_4$ as the polishing stopper film 52.

Therefore, there is a problem that waste Al, which is difficult to remove, is produced during the polishing process. In detail, the Al film 54 is not sufficiently chemical-resistant, so that any chemicals having supreme washing effects cannot be used therefor.

In addition, due to softness, the Al film 54 can easily be polished excessively and the remaining Al film 54 in the through holes 49 can easily be injured or damaged during the washing process.

There is another problem in that the surface of the interlayer insulator film 51 cannot be flattened extensively because the $Si_3N_4$ film 52 as the polishing stopper is formed on the interlayer insulator film 51.

SUMMARY OF THE INVENTION

Accordingly, an object of the present invention is to provide a method of forming a flat surface of an insulator film of a semiconductor device, in which there can be no excessive removal by polishing.

Another object of the present invention is to provide a method of forming a flat surface of an insulator film of a semiconductor device, in which waste produced during the polishing process is easily removed.

Still another object of the present invention is to provide a method of forming a flat surface of an insulator film of a semiconductor device, which can provide a flat surface of an interlayer insulator film extensively.

In a method of forming a flat surface of an insulator film of a semiconductor device according to a first aspect of the present invention, a first wiring film is formed on or over a semiconductor substrate and a first insulator film is formed on the first wiring film. The first insulator film and the first wiring film are patterned to a given shape in the same patterning process.

A second insulator film is formed on the first insulator film thus patterned. The second insulator film is relatively higher in polishing rate than the first insulator film.

Then, a surface of the second insulator film is polished to be flattened under pressure until the first insulator film is exposed.

Thereafter, in general, an interlayer insulator film is formed on the flattened surface of the second insulator film and through holes are formed in the interlayer insulator film and the second insulator film. A second wiring film is formed on the interlayer insulator film to be interconnected with the first wiring film through the through holes.

In a method of forming a flat surface of an insulator film of a semiconductor device according to a second aspect of the present invention, a first wiring film is formed on or over a semiconductor substrate and to be patterned to a given shape.

A first insulator film is formed on the first wiring film thus patterned and a second insulator film is formed on the first insulator film. The second insulator film is relatively higher in polishing rate than the first insulator film.

Then, a surface of the second insulator film is polished to be flattened under pressure until the first insulator film is exposed.

Thereafter, in general, an interlayer insulator film is formed on the flattened surface of the second insulator film and through holes are formed in the interlayer insulator film and the second insulator film. A second wiring film is formed on the interlayer insulator film to be interconnected with the first wiring film through the through holes.

As the first and second insulator films, any two insulator films may be used if they are different in polishing rate from each other. However, a silicon nitride film and a silicon dioxide film are preferably used as the first and second insulator films, respectively.

With the methods according to the first and second aspects, the second insulator film with the relatively higher polishing rate is polished and the first insulator film with the relatively lower polishing rate disposed under the first insulator film is used as a polishing stopper.

Therefore, an excessive polishing action is ensured to be stopped by the first insulator film, so that there arises no excessive removal by polishing.

Also, since the second insulator film is polished to be removed, waste produced during the polishing process is made of the material of the second insulator film, which is easily removed.

Since the first wiring film is covered with the first insulator film, it is not easily inured.

Further, since the difference in polishing rate between the first and second insulator films is utilized and the first insulator film is used as a polishing stopper, an extensively flat surface of an interlayer insulator film can be provided.

DESCRIPTION OF THE PREFERRED EMBODIMENTS

Figure 1A:
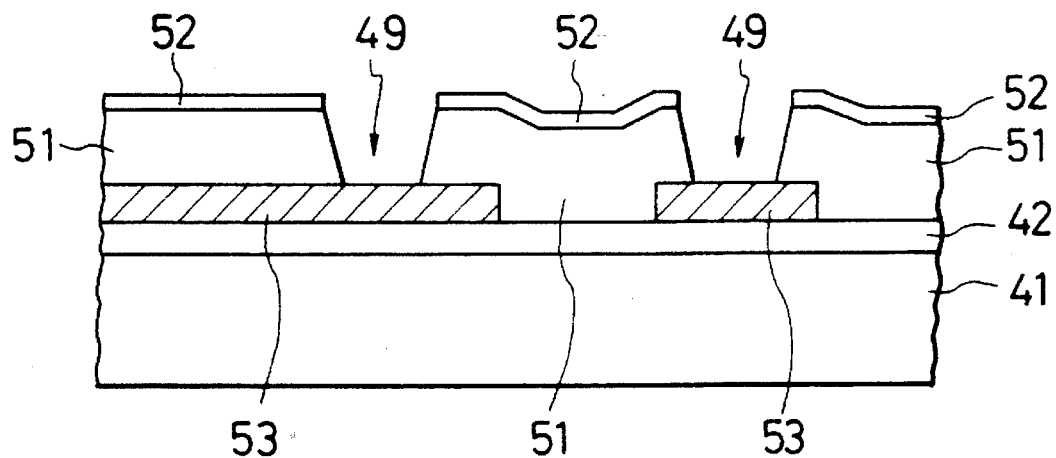
FIGS. 1A to 1D are cross-sectional views showing a conventional method of forming a flat surface of an insulator film of a semiconductor device, respectively.
Figure 1B:
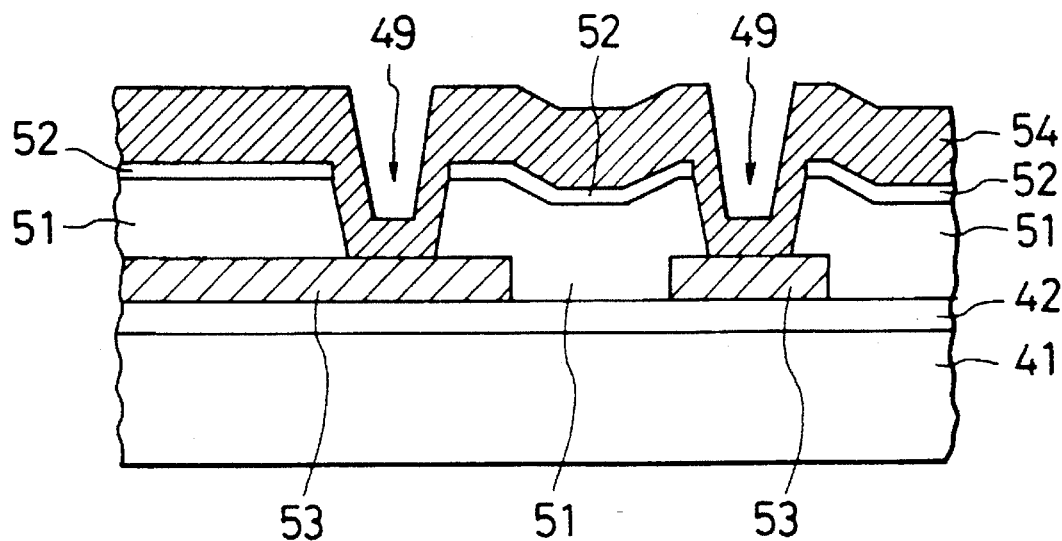
Figure 1C:
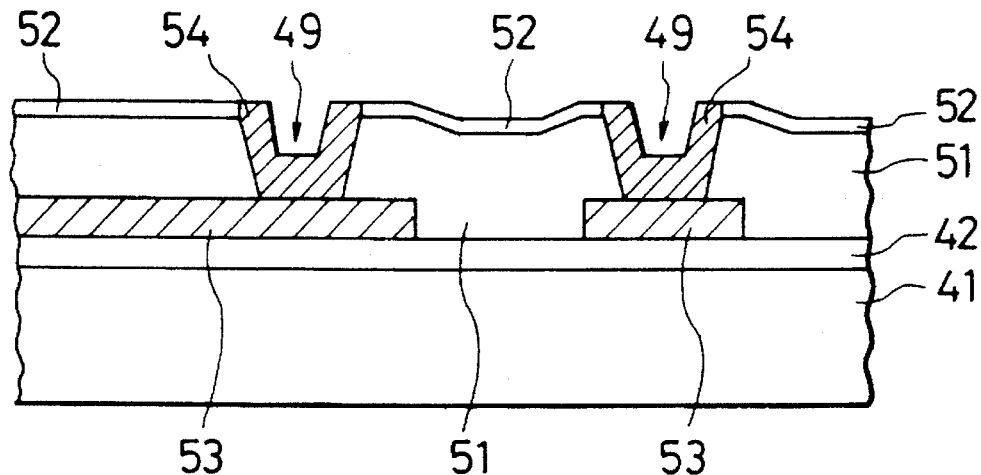
Figure 1D:
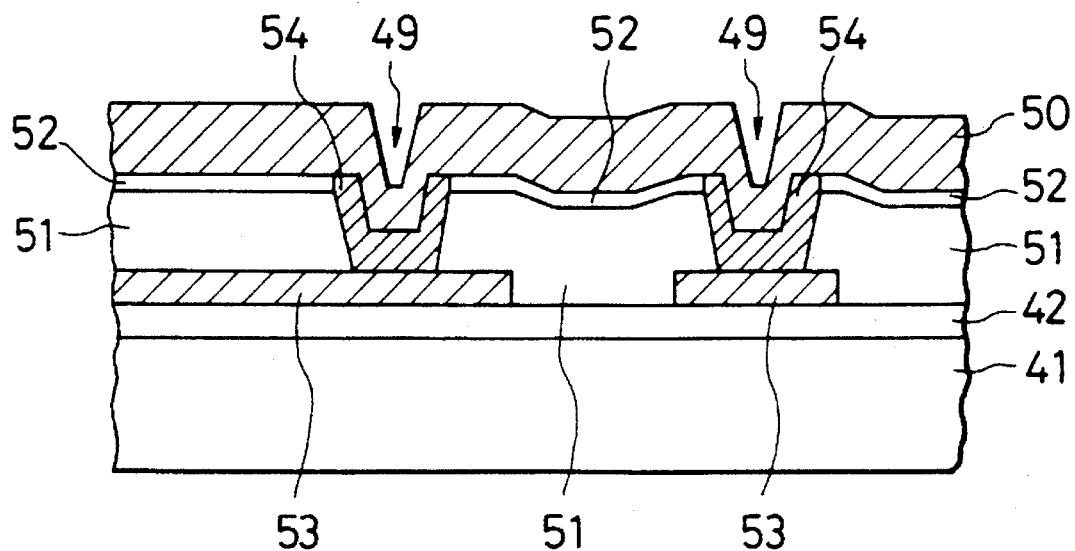

Preferred embodiments of the present invention will be described below while referring to the drawings attached.

First Embodiment

Figure 2A:
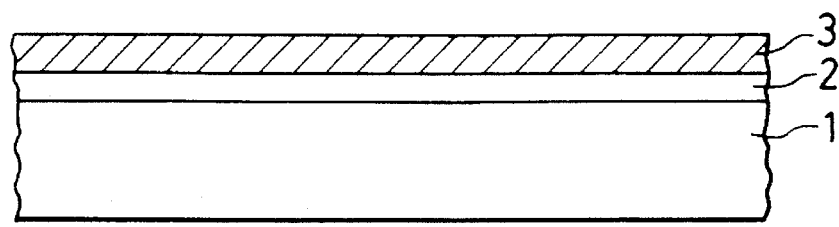
FIGS. 2A to 2I are cross-sectional views showing a method of forming a flat surface of an insulator film of a semiconductor device according to a first embodiment of the invention, respectively.

First, as shown in FIG. 2A, a silicon dioxide ($SiO_2$) film 2 is formed on the surface of a silicon substrate 1 where integrated circuits (Ics) are produced therein, and a first wiring film 3 having a thickness of 0.5 μm is formed on the $SiO_3$ film 2 by a sputtering method. Here, the first wiring film 3 is made of an aluminum (Al) alloy containing 1-wt % copper (Cu), or Al-1% Cu alloy.

Figure 2B:
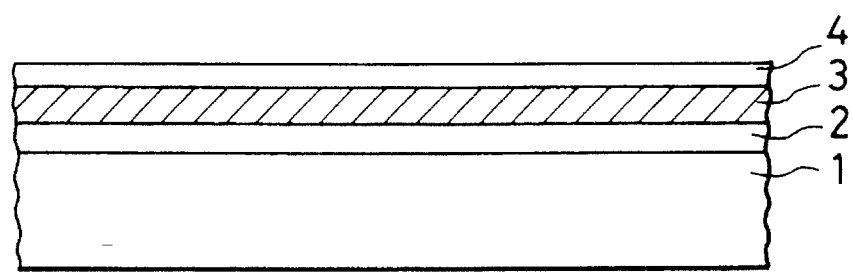

Next, as shown in FIG. 2B, a first insulator layer of silicon nitride ($Si_3N_4$) film 4 having a thickness of 0.5 μm is formed on the first wiring film 3 by a plasma-enhanced CVD method.

Figure 2C:
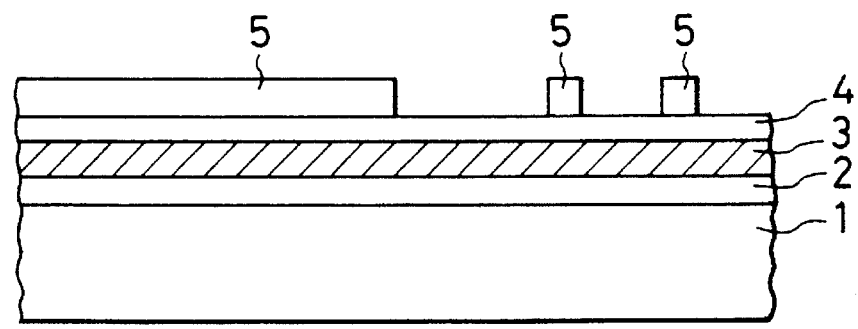

A photoresist film is formed on the $Si_3N_4$ film 4 by a spin coating method and is exposed with an automatic exposure system, or a stepper, to be developed. Thus, a mask 5 with a given pattern is obtained on the $Si_3N_4$ film 4, as shown in FIG. 2C.

Using the mask 5, the $Si_3N_4$ film 4 is selectively removed by anisotropic dry etching. Thus, the pattern of the mask 5 is transferred to the $Si_3N_4$ film 4.

After the mask 5 is removed, using the patterned $Si_3N_4$ film 4 as a mask, the first wiring film 3 is selectively removed by anisotropic dry etching. Thus, the pattern of the mask 5 is further transferred to the first wiring film 3.

Figure 2D:
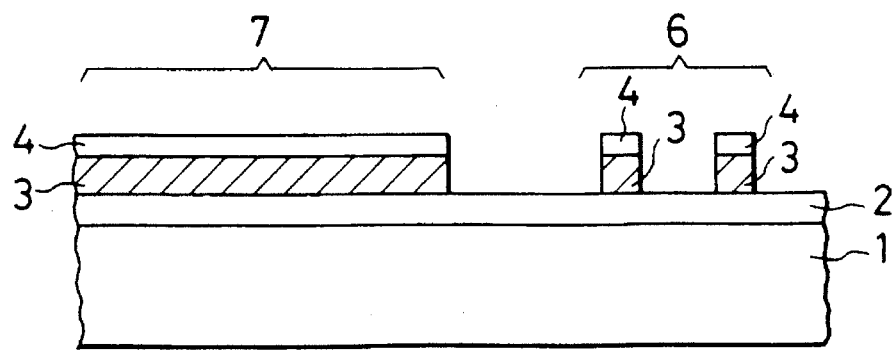

As a result, a first wiring region 6 of a smaller area and a second wiring region 7 of a larger area are provided on the $SiO_3$ film 2, as shown in FIG. 2D. A maximum wiring line width is 5 μm or less in the first wiring region 6, and that is 100 μm or more in the second wiring region.

Figure 2E:
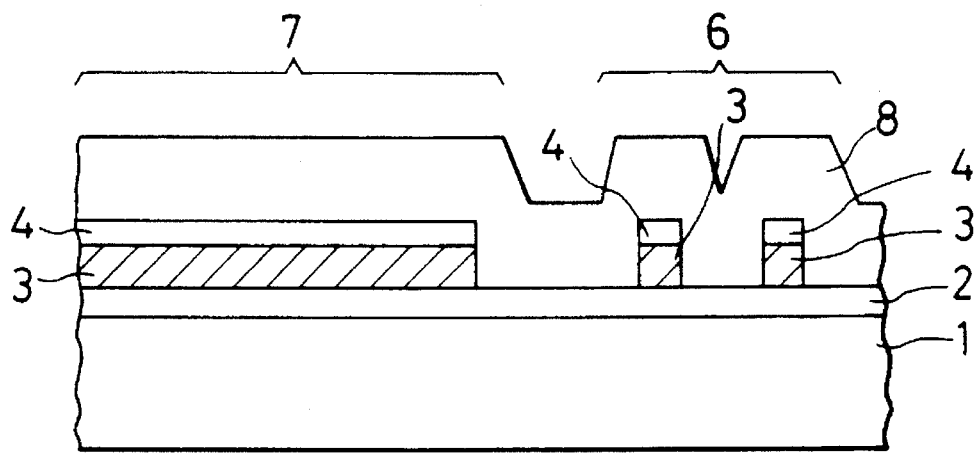

Subsequently, a second insulator layer of $SiO_2$ film 8 having a thickness of 1.5 μm is formed on the first insulator layer of $Si_3 N_4$ film 4 by an electron cyclotron resonance (ECR) plasma-enhanced CVD method. The $SiO_2$ film 8 thus produced is preferable for this purpose because of no void. As shown in FIG. 2E, the $SiO_3$ film 8 is in contact with the $SiO_2$ film 2 at the positions where the $Si_3N_4$ film 4 and the first wiring film 3 do not exist. There are protrusions on the surface of the $SiO_3$ film 8 at positions corresponding to the remaining $Si_3N_4$ film 4 and the remaining first wiring film 3.

The substrate 1 with the above described structure thereon is set on a fixed table of a polishing machine. The surface of the $SiO_3$ film 8 is contacted with a polishing cloth attached on the fixed table. The substrate 1 and polishing cloth are relatively moved with each other under pressure to polish the surface of the $SiO_3$ film 8 using colloidal silica slurry as a polishing agent.

The polishing process is continued until the protrusions of the $SiO_2$ film 8 are removed and the remaining $Si_3N_4$ film 4 is exposed.

During the polishing process, due to difference in applied pressure, the first wiring region 6 of a small area is larger in polishing rate or speed than the second wiring region 7 of a large area so that the remaining $Si_3N_4$ film 4 in the first wiring region 6 tends to be exposed to the remaining $Si_3N_4$ film 4 in the second wiring region 6.

Figure 2F:
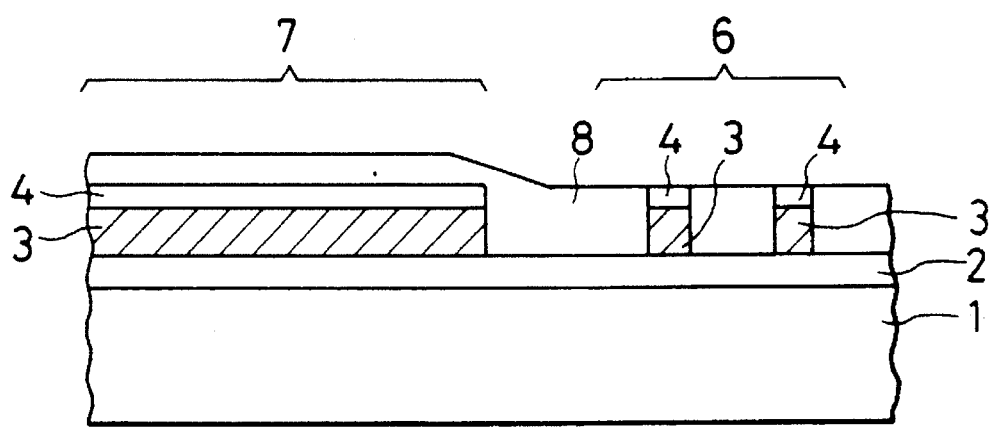

As a result, after the polishing process, as shown in FIG. 2F, only the remaining $Si_3N_4$ film 4 in the first wiring region 6 is exposed and the remaining $Si_3N_4$ film 4 in the second wiring region 7 is not exposed.

Since the first insulator layer of $Si_3N_4$ 4 is approximately one tenth in polishing rate of the second insulator layer of the $SiO_2$ 8, the part of the film 8 in the second region 7 is removed faster than the $Si_3N_4$ film 4. This means that the part of the $Si_3N_4$ film 4 in the first region 6 substantially acts as a polishing stopper.

As described above, even if the $SiO_3$ film 8 in the state as shown in FIG. 2F is polished until the remaining $Si_3N_4$ film 4 in the second wiring region 7 is exposed from the $SiO_3$ film 8, the remaining $Si_3N_4$ film 4 in the first region 6 is hardly removed.

The polishing process is stopped when the remaining $Si_3N_4$ film 4 in the second region 7 is exposed from the $SiO_3$ film 8.

Figure 2G:
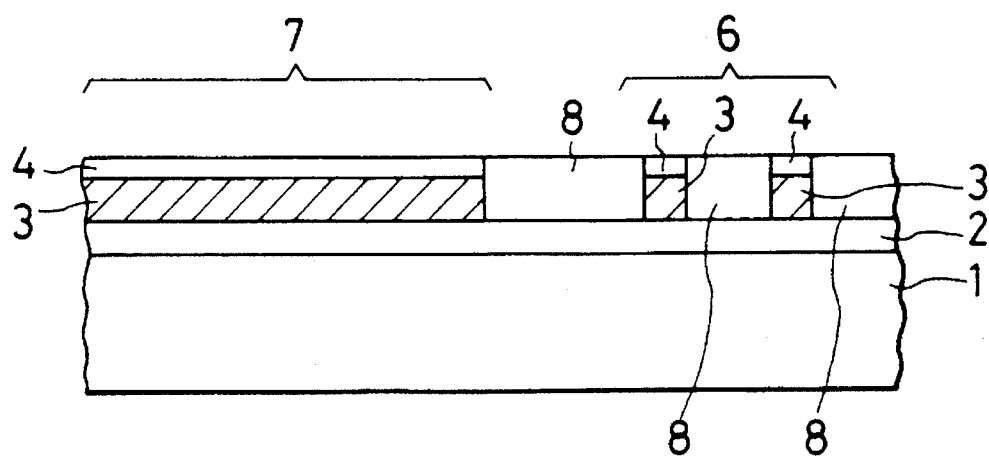

As a result, a flat surface of the layered structure formed on the substrate 1 is obtained, as shown in FIG. 2G.

Figure 2H:
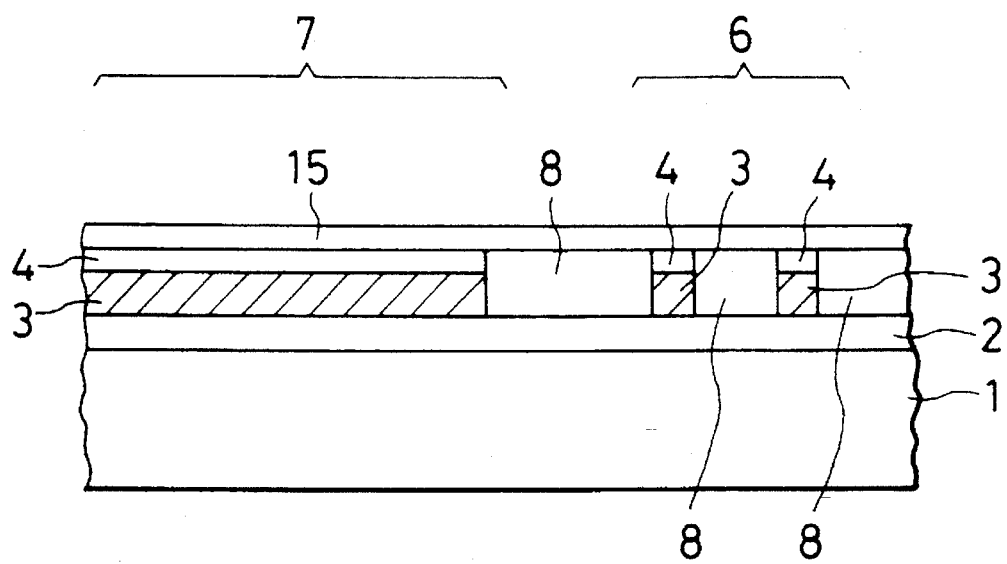

Subsequently, as shown in FIG. 2H, an $SiO_2$ film 15 is formed on the surface of the layered structure by a CVD method as an interlayer insulator film.

Through holes 9 are formed in the second wiring region 7 to pass through the $SiO_2$ film 15 and the remaining $Si_3N_4$ film 4 to reach the surface of the first wiring film 3. After than, an Al film 14 is formed on the $SiO_3$ interlayer insulator film 15 by a sputtering method and is removed by an etching method so that the Al film 14 is left in the respective through holes 9.

Figure 2I:
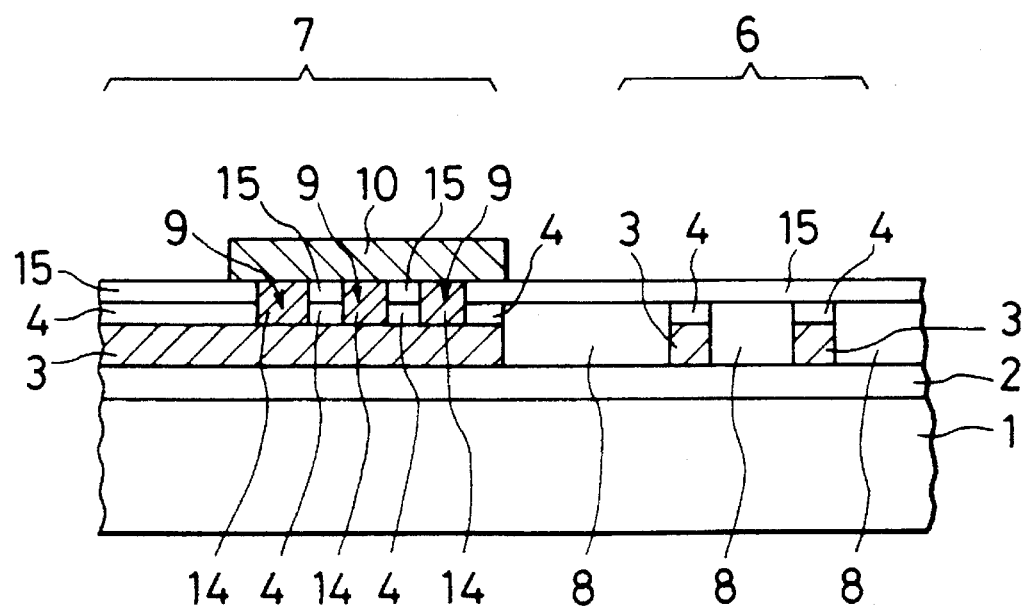

Then, a second wiring film 10 is formed on the $SiO_2$ interlayer insulator film 15 to be patterned to a given shape. Thus, the second wiring film 10 patterned is interconnected to the first wiring film 3 patterned through the Al film 14 left in the respective through holes 9. The state at this time is shown in FIG. 2I.

As described above, with the method of the first embodiment, the $Si_2N_4$ film 4 as a first insulator film with a relatively lower polishing rate is disposed under the second $SiO_2$ insulator film 8 which has a relatively higher polishing rate so that film 4 is used as a polishing stopper. Therefore, an excessive polishing action is ensured to be stopped by the $Si_3N_4$ film 4, so that there arises no excessive removal of the $SiO_2$ film 8 by polishing.

Also, since the $SiO_2$ film 8 is polished to be removed, waste produced during the polishing process is made of $SiO_2$ which is easy to be removed.

Since the first wiring film 3 is covered with the $Si_3N_4$ film 4, it is easily injured.

Further, since the difference in polishing rate between the $Si_3N_4$ and $SiO_2$ films 4 and 8 is utilized and the $Si_3N_4$ film 4 is use as a polishing stopper, an extensively flat surface of the $SiO_2$ interlayer insulator film 15 can be provided.

In the first embodiment, the $Si_3N_4$ film 4 acting as a polishing stopper is also used as a mask for patterning the first wiring film 3, so that there is an advantage that finely-patterned interconnection can be obtained well.

Second Embodiment

FIGS. 3A to 3G show a method of a second embodiment.

Figure 3A:
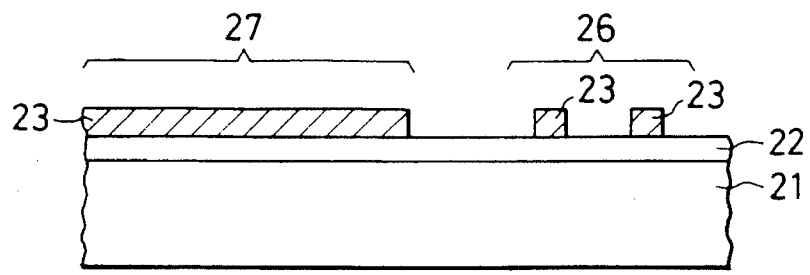
FIGS. 3A to 3G are cross-sectional views showing a method of forming a flat surface of an insulator film of a semiconductor device according to a second embodiment of the invention, respectively.

First, as shown in FIG. 3A, an $SiO_3$ film 22 is formed on the surface of a silicon substrate 21 where ICs are produced therein, and a first wiring film 23 made of Al-1% Cu alloy and having a thickness of 0.5 μm is formed on the $SiO_2$ film 22 by a sputtering method. The processes are the same as those in the first embodiment.

Then, the first wiring film 23 is patterned by the same way as that in the first embodiment (refer to FIGS. 2C and 2D) so that a first wiring region 26 of a smaller area and a second wiring region 27 of a larger area are provided on the $SiO_2$ film 22, as shown in FIG. 3A.

Figure 3B:
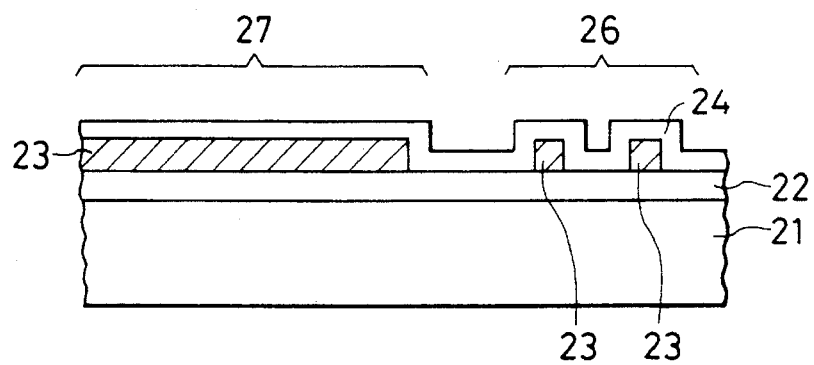

Next, as shown in FIG. 3B, a first insulator $Si_3N_4$ film 24 having a thickness of 0.3 μm is formed on the first wiring film 23 by a plasma-enhanced CVD method. The $Si_3N_4$ film 24 is in contact with the surface of the $SiO_2$ film 22 at positions where the patterned first wiring film 23 does not exist.

Figure 3C:
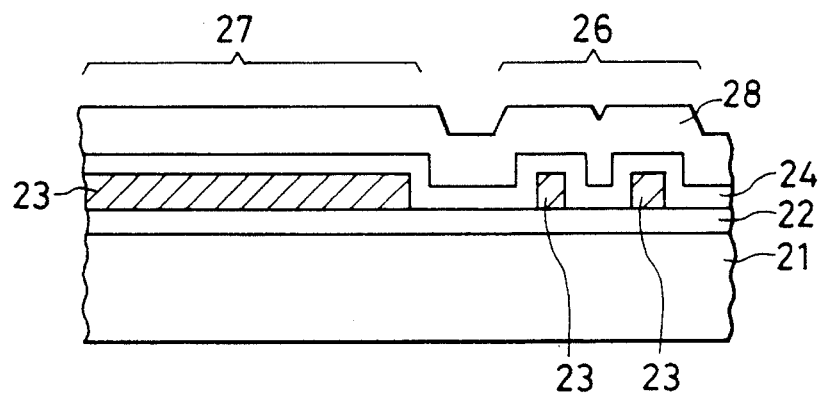

Subsequently, as shown in FIG. 3C, a second insulator $SiO_2$ film 28 having a thickness of 0.8 μm and no void is formed on the $Si_3N_4$ film 24 by an ECR plasma-enhanced CVD method. There are protrusions on the surface of the $SiO_3$ film 28 at positions corresponding to the first and second wiring regions 26 and 27.

The substrate 21 with the above described structure thereon is set on a fixed table of a polishing machine and the surface of the $SiO_3$ film 28 is polished to be selectively removed, in the same way as that in the first embodiment.

Figure 3D:
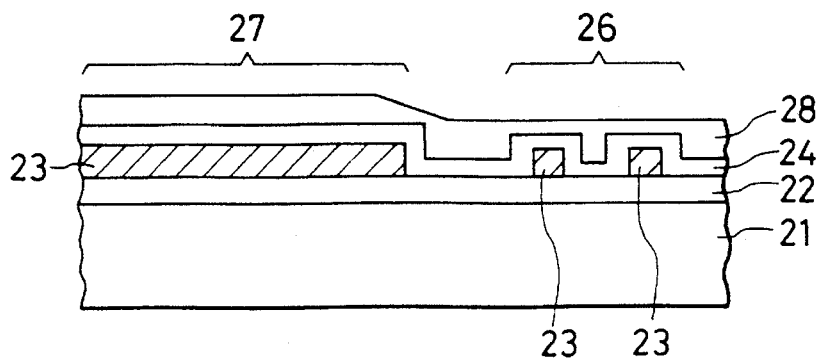

During the polishing process, due to difference in applied pressure, the first wiring region 26 of a small area is larger in polishing rate than the second wiring region 27 of a large area, so that the remaining $Si_3N_4$ film 24 in the first wiring region 26 is more easily removed than the remaining $Si_3N_4$ film 24 in the second wiring region 26. Therefore, there arises a step between the first and second wiring regions 26 and 27 on the surface of the $SiO_2$ film 28, as shown in FIG. 3D.

Figure 3E:
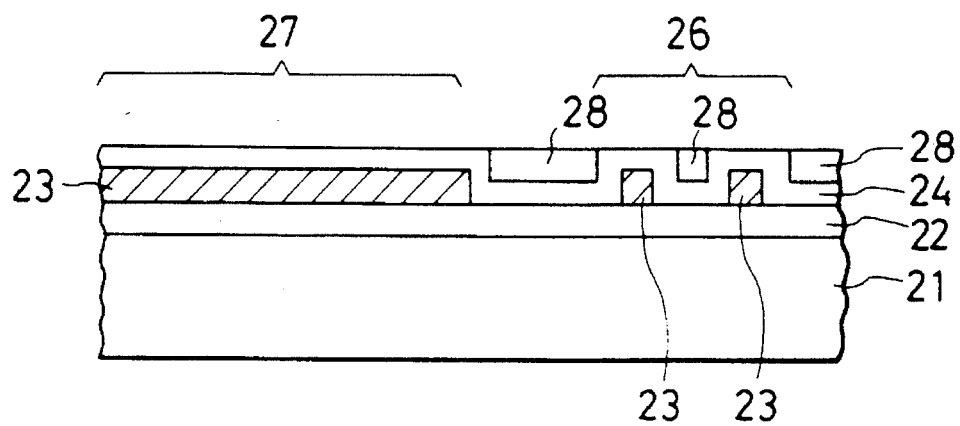

Since the remaining $Si_3N_4$ film 24 in the first wiring region 26 acts as a polishing stopper after the film 24 is exposed, as shown in FIG. 3E, the remaining $Si_3N_4$ film 24 in the first and second wiring regions 26 and 27 is exposed.

As a result, a flat surface of the layered structure formed on the substrate 21 is obtained, as shown in FIG. 3E.

Figure 3F:
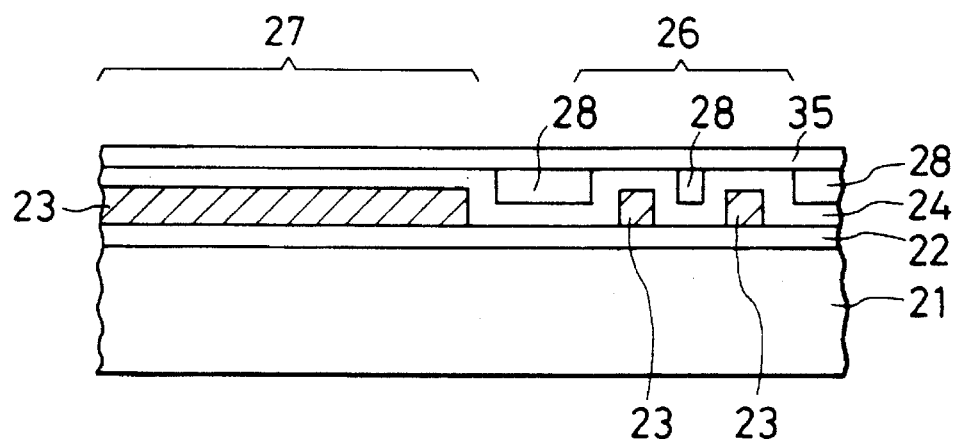

Subsequently, an $SiO_2$ film 35 is formed on the surface of the layered structure by a CVD method as an interlayer insulator film, as shown in FIG. 3F.

Through holes 29 are formed in the second wiring region 27 to pass through the $SiO_2$ interlayer insulator film 35 and the part of the $Si_3N_4$ film 24 to reach the surface of the first wiring film 23. After that, an Al film 34 is formed on the $SiO_2$ interlayer insulator film 35 by a sputtering method and is removed by an etching method so that the Al film 34 is left in the respective through holes 29.

Figure 3G:
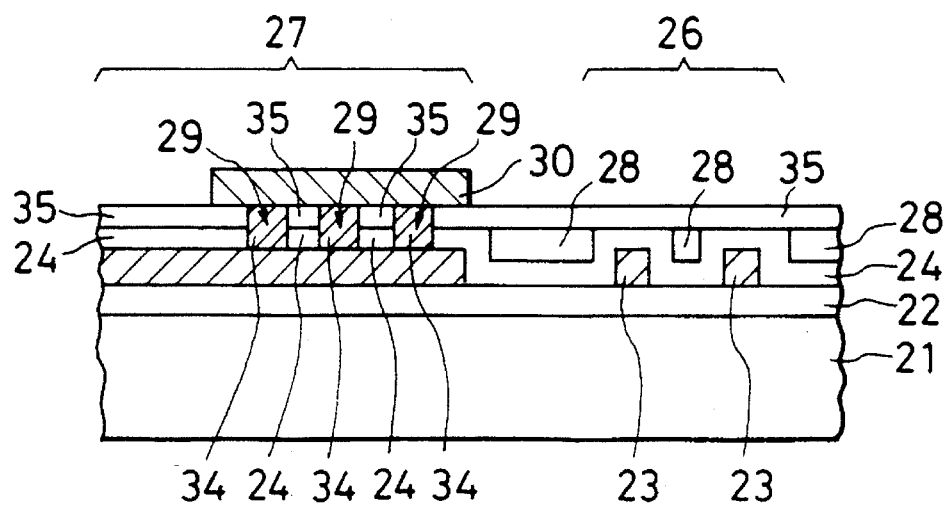

Then, a second wiring film 30 is formed on the $SiO_2$ interlayer insulator film 35 to be patterned to a given shape. Thus, the patterned second wiring film 30 is interconnected to the first patterned second wiring film 30 is interconnected to the first patterned wiring film 23 through the Al film 34 left in the respective through holes 29. The state at this time is shown in FIG. 3G.

As described above, in the first embodiment, since the $Si_3N_4$ film 24 acting as a polishing stopper is also used as a mask for patterning the first wiring film 3, finely-patterned interconnection can be obtained.

However, since the $Si_3N_4$ film 4 is heated in the patterning process of the first wiring film 3, there is a disadvantage that etching residue to easy to be produced in the patterning process when the first wiring film 3 is made of a material containing plenty of impurity such as Si.

The second embodiment, overcomes this problem by forming the $Si_3N_4$ film 24 by a plasma-enhanced CVD method after patterning the first wiring film 23, so that there is no possibility of etching residue produced in the patterning process of the first wiring film 23.

In the above first and second embodiments, the $Si_3N_4$ and $SiO_2$ films are used as the first and second insulator films different in polishing rate from each other, respectively, however, any other films may be used if they have different polishing rates.

While the preferred forms of the present invention have been described, it is to be understood that modification will be apparent to those skilled in the art without departing from the spirit of the invention. The scope of the invention, therefore, is to be determined solely by the following claims.

What is claimed is:

1. A method of forming a flat surface of an insulator film of a semiconductor device, comprising the steps of:

forming a first wiring film on a semiconductor substrate;

forming a first insulator film on said first wiring film;

forming a patterned resist film on said first insulator film;

patterning said first insulator film to a pattern using said patterned resist film as a mask;

patterning said first wiring film using said patterned first insulator film as a mask;

removing said patterned resist film to produce said patterned first wiring film formed on said substrate and said patterned first insulator film formed over said patterned first wiring film, said patterned first wiring film and said patterned first insulator film having spaces formed therein;

forming a second insulator film on said patterned first insulator film to fill said spaces with said second insulator film, said first insulator film being relatively lower in polishing rate than said second insulator film, said second insulator film having a surface being uneven due to said patterned first wiring film and said patterned first insulator film; and polishing said uneven surface of said second insulator film under pressure until said first insulator film is exposed to flatten said uneven surface of said second insulator film, said spaces remaining filled with said second insulator film;

wherein said patterned first wiring film has a first wiring region and a second wiring region, said first wiring region being relatively lower in polishing rate than said second wiring region; and wherein said patterned first insulator film acts as a polishing stopper in said second wiring region to compensate for a difference in polishing rate between said first wiring region and said second wiring region during polishing.

2. A method as claimed in claim 1, wherein said first insulator film is a silicon nitride film and said second insulator film is a silicon oxide film.

3. A method as claimed in claim 1, wherein said first insulator film is a silicon nitride film produced by a plasma-enhanced CVD method and said second insulator film is a silicon oxide film produced by a plasma-enhanced CVD method.

4. A method of forming a flat surface of an insulator film of a semiconductor device, comprising the steps of:

forming a first wiring film on a semiconductor substrate;

patterning said first wiring film to a pattern to produce a patterned first wiring film having spaces formed therein;

forming a first insulator film on said first patterned wiring film so that said first insulator film partially fills said spaces and said first insulator film has spaces formed therein;

forming a second insulator film on said first insulator film to fill said spaces in said first insulator film with said second insulator film, said second insulator film having an uneven surface due to said patterned first wiring film, said first insulator film being relatively lower in polishing rate than said second insulator film; and polishing said uneven surface of said second insulator film under pressure until said first insulator film is exposed to flatten said uneven surface of said second insulator film, said spaces in said first insulator film remaining filled with said second insulator film;

wherein said patterned first wiring film has a first wiring region and a second wiring region, said first wiring region being relatively lower in polishing rate than said second wiring region; and wherein said first insulator film acts as a polishing stopper in said second wiring region to compensate for the difference in polishing rate between said first wiring region and said second wiring region during polishing.

5. A method as claimed in claim 4, wherein said first insulator film is a silicon nitride film and said second insulator film is a silicon oxide film.

6. A method as claimed in claim 4, wherein said first insulator film is a silicon nitride film produced by a plasma-enhanced CVD method and said second insulator film is a silicon oxide film produced by a plasma-enhanced CVD method.

7. The method of claim 1, further comprising the following steps:

forming a third insulator film on a polished surface of the first and second polished insulator films;

forming through holes defined by an inner surface in said third insulator film and said first insulator film so that said through holes extend to said patterned first wiring film;

selectively forming a conductor film over said inner surface defining said through holes, said conductor film being in contact with said patterned first wiring film; and forming a patterned second wiring film on said third insulator film so that said patterned second wiring film is in contact with said conductor film;

wherein said patterned first wiring film is electrically interconnected with said second patterned wiring film through said conductor film.

8. The method of claim 4, further comprising the following steps:

forming a third insulator film on a polished surface of the first and second polished insulator films;

forming through holes defined by an inner surface in said third insulator film and said first insulator film so that said through holes extend to said patterned first wiring film;

selectively forming a conductor film over said inner surface defining said through holes, said conductor film being in contact with said patterned first wiring film; and forming a patterned second wiring film on said third insulator film so that said patterned second wiring film is in contact with said conductor film;

wherein said patterned first wiring film is electrically interconnected with said second patterned wiring film through said conductor film.

* * * * *